(12) United States Patent
Kinzer

(10) Patent No.: US 7,273,771 B2
(45) Date of Patent: Sep. 25, 2007

(54) COMMON MOSFET PROCESS FOR PLURAL DEVICES

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 9 days.

(21) Appl. No.: 11/054,473

(22) Filed: Feb. 9, 2005

(65) Prior Publication Data

US 2005/0191809 A1    Sep. 1, 2005

Related U.S. Application Data

(60) Provisional application No. 60/543,320, filed on Feb. 9, 2004.

(51) Int. Cl.
*H01L 21/332* (2006.01)
*H01L 21/00* (2006.01)

(52) U.S. Cl. .............. 438/135; 438/138; 438/156; 438/173; 438/192

(58) Field of Classification Search ........ 438/135–138, 438/156, 173, 192, 212
See application file for complete search history.

(56) References Cited

U.S. PATENT DOCUMENTS 6,825,105 B2 * 11/2004 Grover et al. .............. 438/570
2003/0047778 A1 * 3/2003 Nakamura et al. .......... 257/330

* cited by examiner

*Primary Examiner*—Hsien-Ming Lee
(74) *Attorney, Agent, or Firm*—Ostrolenk, Faber, Gerb & Soffen, LLP

(57) ABSTRACT

A core process is described for the manufacture of a Schottky, MOSFET or Accufet, using a plurality of identical manufacturing steps, including spaced trenches, in a single production line, with the device type to be produced being defined at an implant and diffusion stage for forming very low concentration mesas for a Schottky; higher concentration mesas with source regions for Accufet devices and a channel implant and source implant for a vertical conduction MOSFET.

7 Claims, 2 Drawing Sheets

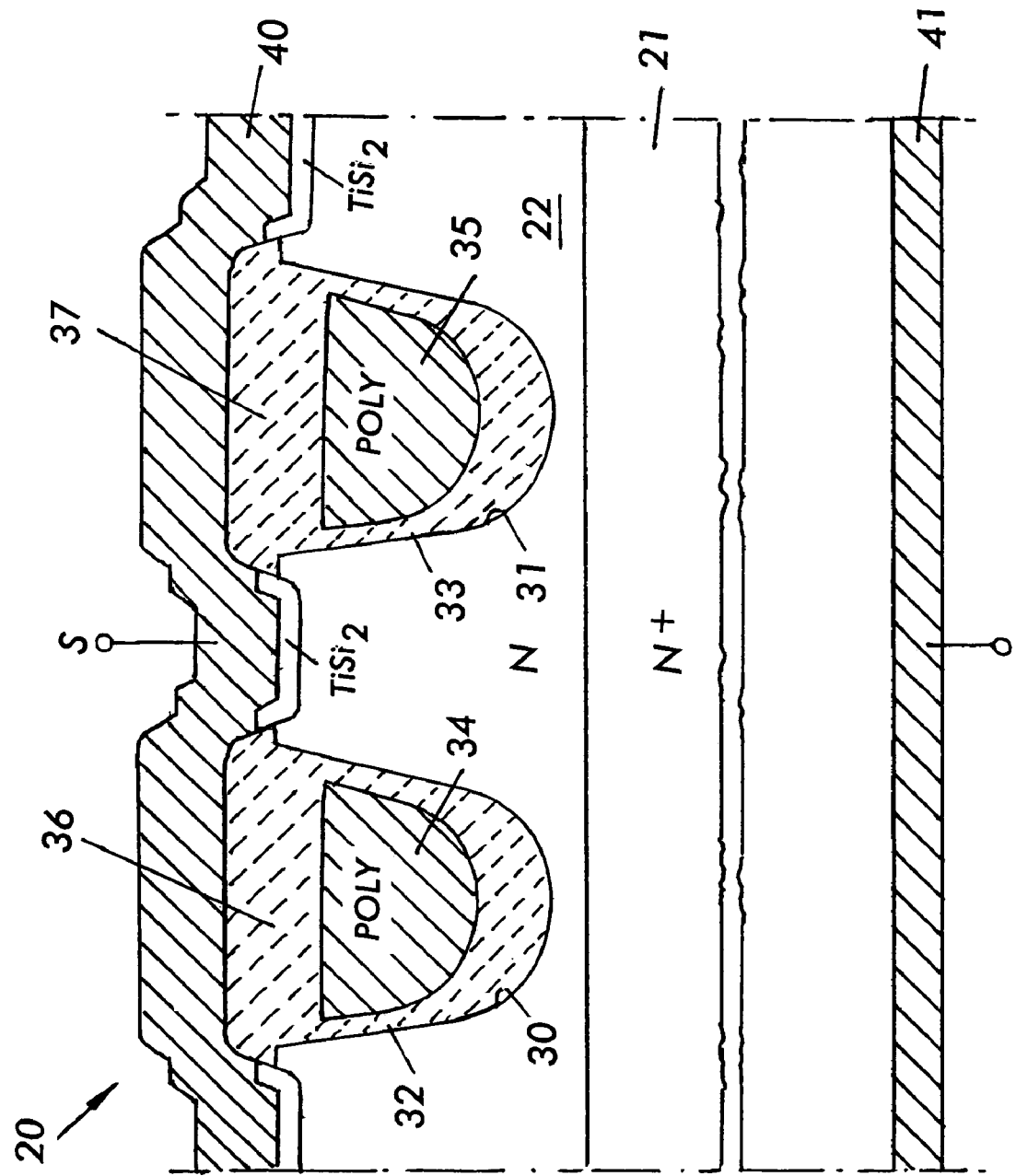
FIG. 1 (COMMON ELEMENTS)

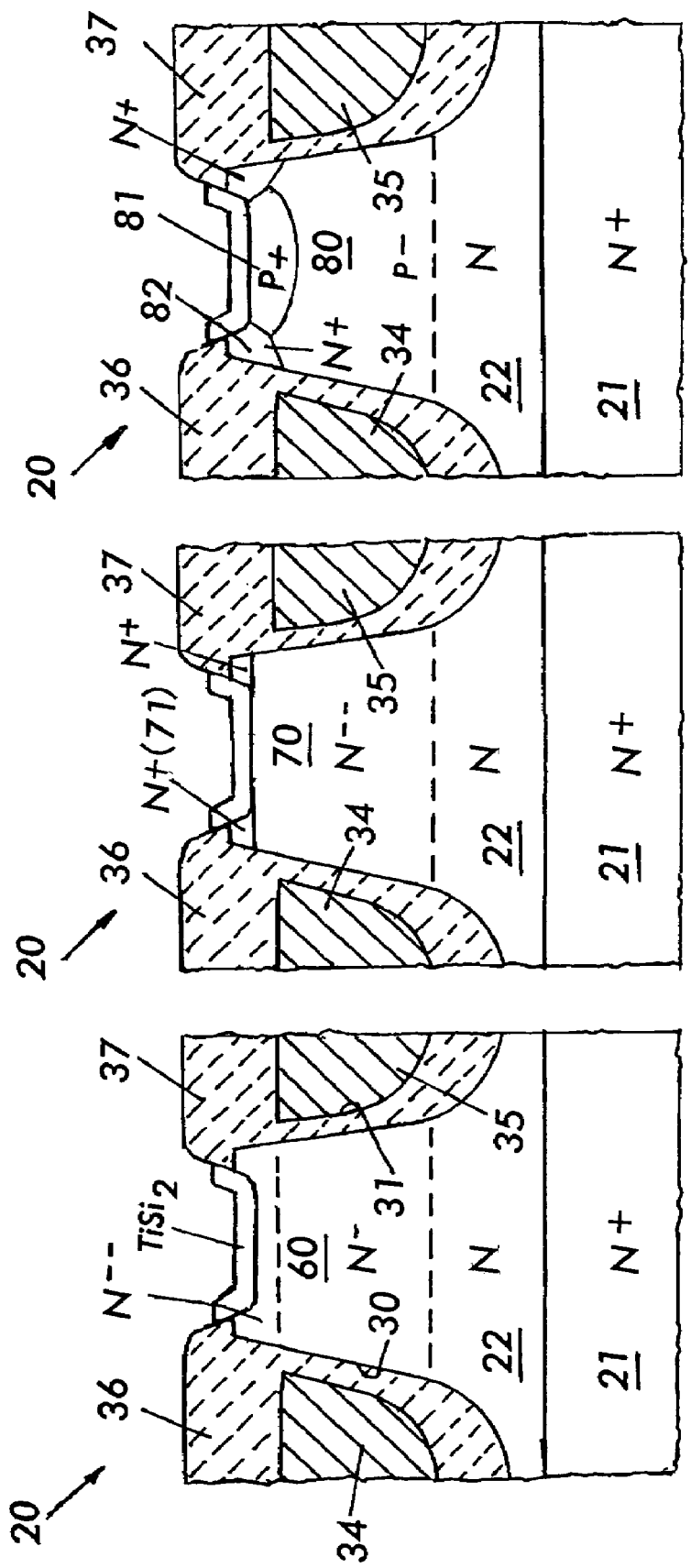

COMMON MOSFET PROCESS FOR PLURAL DEVICES

RELATED APPLICATION

This application claims the benefit of U.S. Provisional Application No. 60/543,320, filed Feb. 9, 2004.

FIELD OF THE INVENTION

This invention relates to semiconductor devices and more specifically relates to a common or base process and fabrication equipment therefore which can be easily modified to produce a variety of different devices.

BACKGROUND OF THE INVENTION

Semiconductor fabrication lines and equipment and processes are commonly tailored for the manufacture of wafers with a given die structure. Thus different lines are dedicated to the manufacture of a single type device, for example, only a Schottky diode; or only an Accufet device (such as shown in U.S. Pat. No. 6,437,390) or only a vertical conductor trench type power MOSFET. Because the lines are dedicated to a particular product, the whole line will be closed when there is a reduced demand for that particular product, thus wasting a large capital investment.

Furthermore, the manufacture of semiconductor devices employs different mask patterns and process steps for the manufacture of different kinds of devices. Thus, different masks, tools and process directions are needed for the manufacture of different devices such as trench type MOSFETs, trench type Schottky diodes, and Accufet MOSFETs.

The different process steps and mask patterns require device specific manufacturing steps and masks, leading to added manufacturing complexity, inventory, operator training and the like.

It would be desirable to reduce the number of steps and masks needed to make diverse devices and to emphasize and exploit the commonality of such devices and their basic processes.

BRIEF DESCRIPTION OF THE INVENTION

In accordance with the invention, selected junction patterns and mask patterns in three diverse devices, e.g. trench MOSFETs; trench Schottkys and Accufet MOSFET devices are identified and employed as common manufacturing steps for each device to establish a basic common process prior to metalizing. The individual devices are made by selecting specific implants prior to the premetal point in the manufacturing process. Thus, multiple devices can be made by the same basic mask set on the same wafer.

Further in accordance with the present invention, a core process and the equipment therefore is arranged to be easily varied to produce a plurality of distinct products with minor process changes that do not require new line design or new line equipment. Accordingly, a device manufacturer would no longer need three dedicated lines with duplicated expensive equipment to be able to manufacture different and distinct products. Further, products with low demand, which might not otherwise warrant the cost of a dedicated product line can now be easily produced on a limited run basis when the single core line can be freed for the low demand product. By way of example, a common core process has been developed which will enable the manufacture of Schottkys, Accufet devices or trench MOSFETs using the same basic equipment of a single processing line.

The novel core process comprises the steps of:
1. Preparing a common wafer of a given concentration type.
2. Preparing the wafer surface.
3. Passing through an ion implant and diffusion stage, which will be adapted to the particular part to be made and epitaxially depositing a junction-receiving layer on the substrate.
4. Go through appropriate cleans and masking and etching parallel (or cellular) trenches into the epi layer and through whatever implant layers were formed in step 3.
5. Forming a gate oxide on the walls of the trenches.
6. Depositing a conductive polysilicon layer over the wafer top to fill the trenches.
7. Etching away the polysilicon over the mesas formed by the trenches and into the trenches themselves.
8. Depositing an interlayer oxide over the top of the polysilicon trench inserts.
9. Depositing a conductive silicide over the mesa tops.
10. Applying top and bottom contacts.

There are obviously related cleans and other acid treatments which are common to the above basic steps.

It now becomes possible, by the use of different implants at step 3 to define a Schottky, or an Accufet device, or a vertical conduction trench MOSFET without a change of any of the other core steps, thus permitting the use of a single line to manufacture any one of 3 distinct devices.

BRIEF DESCRIPTION OF THE DRAWINGS

FIG. 1 shows the basic common junction patterns to be employed for the manufacture of any one of three different products which are differentiated only by selection of different implants before metalizing.

FIG. 2 shows the device of FIG. 1 configured, before metalizing, to be a trench Schottky device.

FIG. 3 shows the device of FIG. 1 configured, before metalizing, to be an Accufet MOSFET device.

FIG. 4 shows the device of FIG. 1 configured, before metalizing, to be a trench MOSFET device.

DETAILED DESCRIPTION OF THE DRAWINGS

FIG. 1 shows the basic common elements of three different devices (of FIGS. 2, 3 and 4) after metalizing. The same basic wafer, mask set and process is used for all devices.

The common device properties are shown for a cross-section of two of a plurality of spaced cells in a silicon wafer 20. Wafer 20 has an N$^+$ body 21 having an N type junction-receiving epitaxial layer 22 thereon. The thickness and concentration of layer 22 are determined by the desired reverse voltage rating for the devices.

A plurality of spaced trenches 30, 31 are formed and lined with gate oxide 32, 33 respectively. The trenches are then filled with polysilicon masses 34, 35 respectively (which will be implanted to be N$^+$ or P$^+$, depending on the device to be made). A cap oxide 36, 37 respectively is then added and etched. A TiSi$_2$ layer is formed on the top of the mesas as shown.

Different implants are employed before the TiSi layer step as will be described for FIGS. 2, 3 and 4, and a source metal 40 and at drain metal 41 are later added.

If the device is to be a trench Schottky (as shown in co-pending application (IR-1663), Ser. No. 10/193,783 entitled TRENCH SCHOTTKY BARRIER DIODE in the names of Kohji Andoh and Davide Chiola), and as shown in FIG. 2, an N⁻ region 60 is formed by implantation before the TiSiO₂ and metalizing step.

If the device to be formed is an Accufet MOSFET device, of the kind shown in U.S. Pat. No. 6,437,390, an N⁻-region 70 and an N⁺ source 71 are formed before the TiSi₂ steps and metalizing.

If the device is to be a trench MOSFET, a P⁻ channel region 80, a P⁺ contact region 81 and an N⁺ source region are added by implanting before the TiSi₂ and metalizing steps.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing a semiconductor device having a plurality of components common to a plurality of distinct device types, said method comprising the steps of:
   supplying a wafer having a high concentration of impurities of a first conductivity type and having an epitaxially deposited layer of a lower concentration of said first conductivity type;
   implanting and diffusing an implant of an impurity of a second conductivity type into the top of said epitaxially deposited layer;
   forming a plurality of spaced trenches into the top of said wafer and through the depth of said impurity of said second conductivity type;
   growing a first layer of insulation on the walls and bottom of said trenches;
   growing a conductive polysilicon mass to fill said trenches;
   depositing an interlayer oxide atop said polysilicon mass;
   depositing a conductive silicide atop mesas formed between said trenches; and
   depositing conductive top and bottom metal electrodes on top and bottom surfaces of said wafer,
   wherein said implant defines the type of the semiconductor device, the type being selected from all of three distinct device types including a Schottky diode, an Accufet device, and a vertical conduction trench-type MOSFET by selection of the second conductivity type, an implant dose and a diffusion drive.

2. The method of claim 1, wherein said implant is a low dose implant of the same conductivity as said epitaxially deposited layer further comprising: a high dose implant to form source regions in said low dose implant.

3. The method of claim 1, wherein said implant is a first low dose implant of the same conductivity as said epitaxially deposited layer and further comprising: a further lower dose implant following said first low dose implant to define a Schottky diode.

4. The method of claim 1, wherein said implant is a low dose implant of the opposite conductivity type to that of said epitaxially deposited layer to form a channel region; and further comprising: a high dose implant of the same conductivity as the epitaxially deposited layer to define a vertical conduction trench type MOSFET.

5. A process of manufacture of a semiconductor device having a plurality of components common to all of three distinct semiconductor device types, said process comprising the steps of:
   a) providing a wafer having a junction-receiving surface of a first conductivity type;
   b) forming a plurality of identical spaced trenches in a junction receiving surface of said wafer, said spaced trenches being separated by mesas;
   c) forming an insulation layer over walls and bottom of each of said trenches;
   d) filling each of said trenches with a conductive polysilicon mass;
   e) insulating each polysilicon mass in each of said trenches by an interlayer oxide;
   f) forming a conductive suicide on tops of the mesas;
   g) forming top and bottom contacts on top and bottom surfaces of said wafer; and
   h) after step (a) and before step (b),
      selecting a conductivity type, an implant dose and a diffusion drive of first dopants to define the type of the semiconductor device selected from all of three distinct semiconductor device types; and
      implanting and diffusing the first dopants necessary to form the distinct semiconductor device.

6. The process of claim 5, wherein said distinct device types are selected from one of a vertical conductive trench type MOSFET and a Schottky diode.

7. A process of manufacture of a semiconductor device selected from all of three distinct types of semiconductor devices having a plurality of identical components, the process comprising the steps of:
   providing a wafer having a junction-receiving surface of a first conductivity types;
   implanting and diffusing at least one diffusion;
   forming a plurality of identical spaced trenches into the junction receiving surface of said wafer, said spaced trenches being separated by mesas;
   forming an insulation layer over the walls and bottom of each of said trenches;
   filling each of said trenches with a conductive polysilicon mass;
   insulating each of the polysilicon masses in each of said trenches by an interlayer oxide;
   forming a conductive suicide on the tops of the mesas; and
   forming top and bottom contacts on the top and bottom surfaces of said wafer;
   wherein said diffusion defines the distinct types of semiconductor devices selected from said all of three distinct types of semiconductor devices including a vertical conductive trench type MOSFET, a Schottky diode and an Accufet device.

* * * * *